(12) United States Patent
Duerr et al.

(10) Patent No.: US 10,807,859 B2
(45) Date of Patent: Oct. 20, 2020

(54) MEMS ACTUATOR, SYSTEM HAVING A PLURALITY OF MEMS ACTUATORS, AND METHOD FOR PRODUCING A MEMS ACTUATOR

(71) Applicant: Fraunhofer-Gesellschaft zur Foerderung der angewandten Forschung e.V., Munich (DE)

(72) Inventors: Peter Duerr, Dresden (DE); Detlef Kunze, Dresden (DE); Andreas Neudert, Dresden (DE); Martin Friedrichs, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 376 days.

(21) Appl. No.: 15/642,694

(22) Filed: Jul. 6, 2017

(65) Prior Publication Data
US 2017/0297897 A1   Oct. 19, 2017

Related U.S. Application Data

(63) Continuation of application No. PCT/EP2016/050465, filed on Jan. 12, 2016.

(30) Foreign Application Priority Data

Jan. 16, 2015 (DE) .......... 10 2015 200 626

(51) Int. Cl.
*B82B 3/00* (2006.01)
*G02B 26/08* (2006.01)
(Continued)

(52) U.S. Cl.
CPC .......... *B81B 3/0027* (2013.01); *B81B 3/0059* (2013.01); *G02B 26/085* (2013.01);
(Continued)

(58) Field of Classification Search
CPC ............ B81B 2203/053; B81B 3/0027; B81B 3/0059; B81B 2201/042;
(Continued)

(56) References Cited

U.S. PATENT DOCUMENTS 4,566,935 A   1/1986 Hornbeck
5,024,500 A * 6/1991 Stanley ................ G02B 6/3566
                                                        385/16
(Continued)

FOREIGN PATENT DOCUMENTS

DE   20122618 U1   11/2006
EP   0286337 A1    3/1988
JP   H01502782 A   9/1989

OTHER PUBLICATIONS

Cho et al. "A low-voltage three-axis electromagnetically actuated micromirror for fine alignment among optical devices" Journal of Micromechanics and Microengineering, vol. 19, pp. 1-8 (Year: 2009).*

(Continued)

*Primary Examiner* — George G King
(74) *Attorney, Agent, or Firm* — Michael A. Glenn; Perkins Coie LLP

(57) ABSTRACT

Embodiments of the present invention provide an MEMS actuator with a substrate, at least one post attached to the substrate and a deflectable actuator body that is connected to the at least one post via at least one spring, wherein, during electrostatic, electromagnetic or magnetic force application, the actuator body takes a second position starting from a first position by a tilt-free translational movement, wherein the first position and the second position are different, and wherein in a top view of the MEMS actuator the actuator body is arranged outside an area spanned by the at least one post.

17 Claims, 14 Drawing Sheets

(51) Int. Cl.
    *H02K 99/00*     (2014.01)
    *H02N 1/00*     (2006.01)
    *B81B 3/00*     (2006.01)
    *G02F 1/01*     (2006.01)

(52) U.S. Cl.
    CPC ..... *G02B 26/0833* (2013.01); *G02B 26/0841* (2013.01); *G02F 1/0128* (2013.01); *H02K 99/20* (2016.11); *H02N 1/002* (2013.01); *B81B 2201/042* (2013.01); *B81B 2203/0118* (2013.01); *B81B 2203/0163* (2013.01); *B81B 2203/053* (2013.01)

(58) Field of Classification Search
    CPC .... B81B 2203/0118; B81B 2203/0163; H02K 99/20; G02B 26/0833; G02B 26/0841; G02B 26/085; G02F 1/0128; H02N 1/002
    See application file for complete search history.

(56) References Cited

U.S. PATENT DOCUMENTS

| | | | |
|---|---|---|---|
| 6,329,738 | B1 | 12/2001 | Hung et al. |
| 6,384,952 | B1 | 5/2002 | Clark et al. |
| 2002/0109894 | A1* | 8/2002 | Clark ............... G02B 26/06 359/224.1 |
| 2004/0114256 | A1 | 6/2004 | Matsuo |
| 2004/0114259 | A1 | 6/2004 | Ishizuya et al. |
| 2006/0126151 | A1 | 6/2006 | Aksyuk et al. |
| 2007/0176719 | A1 | 8/2007 | Levitan et al. |
| 2011/0080627 | A1 | 4/2011 | He et al. |

OTHER PUBLICATIONS

Wikipedia page "Spring (device)" (Year: 2014).*
Duerr, Peter et al., "Micro-Actuator with Extended Analog Deflection at Low Drive Voltage", Proceedings of SPIE vol. 6114, 61140I-1, 2006, 10 pages.
Gehner, Andreas et al., "MEMS Analog Light Processing—an Enabling Technology for Adaptive Optical Phase Control", Proceedings of SPIE vol. 6113, 61130K-1, 2006, 15 pages.
López, D. et al., "Two-Dimensional MEMS Array for Maskless Lithography and Wavefront Modulation", Proceedings of SPIE vol. pp. 6589, 65890S-1, 2007, 9 pages.
Stahl, Richard et al., "Modular Sub-Wavelength Diffractive Light Modulator for High Definition Holographic Displays", Journal of Physics: Conference Series 415 012057, 2013, pp. 1-7.

* cited by examiner

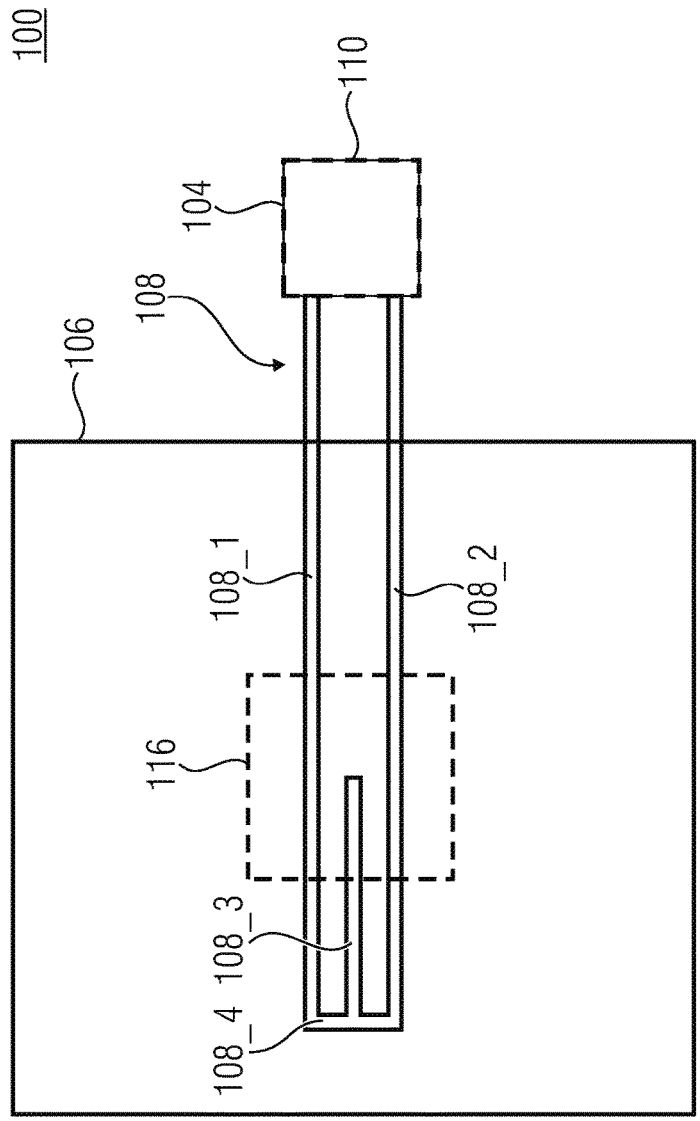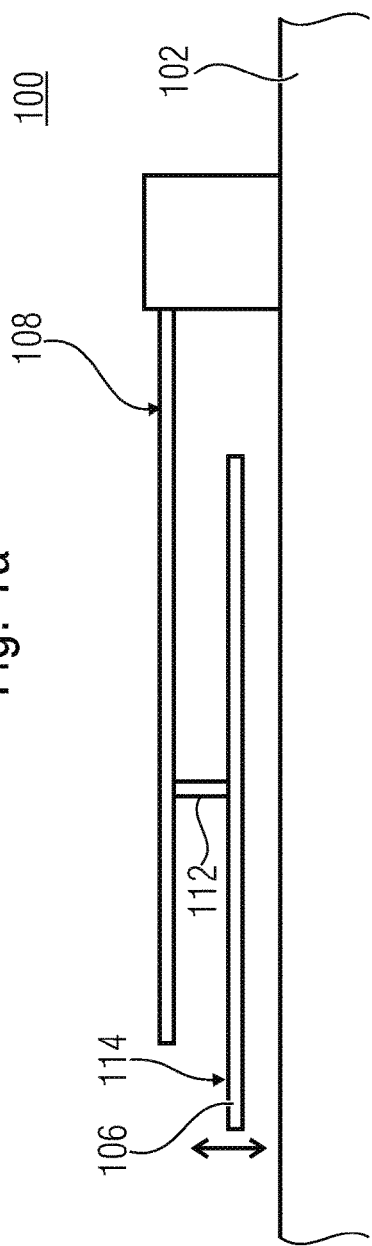

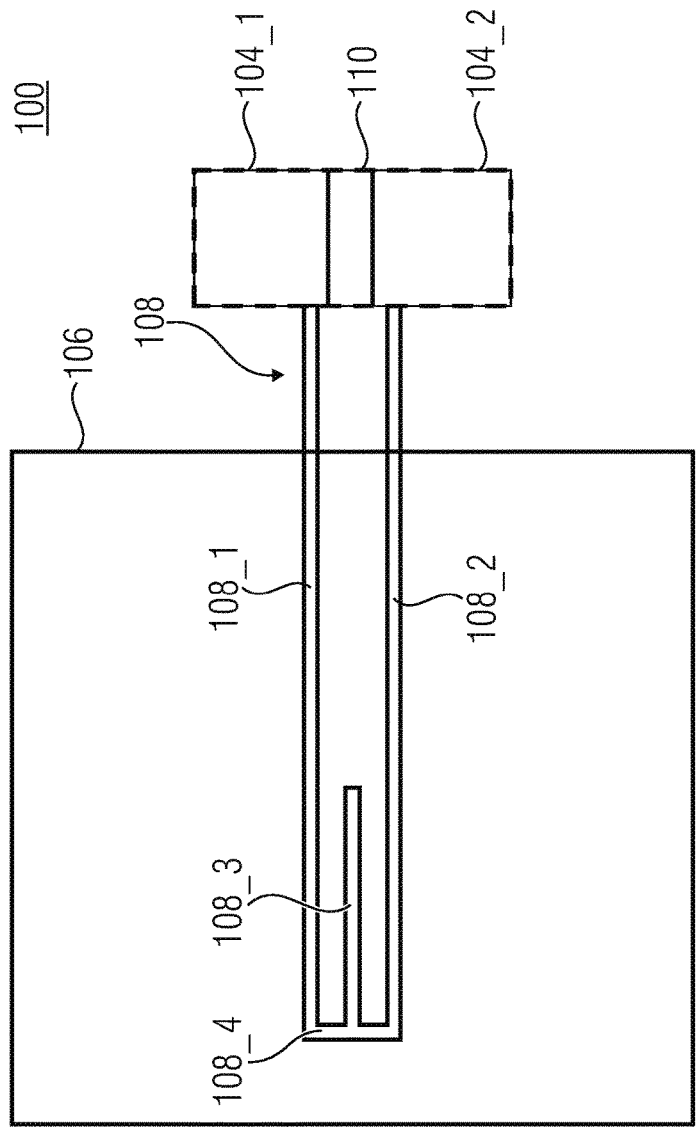
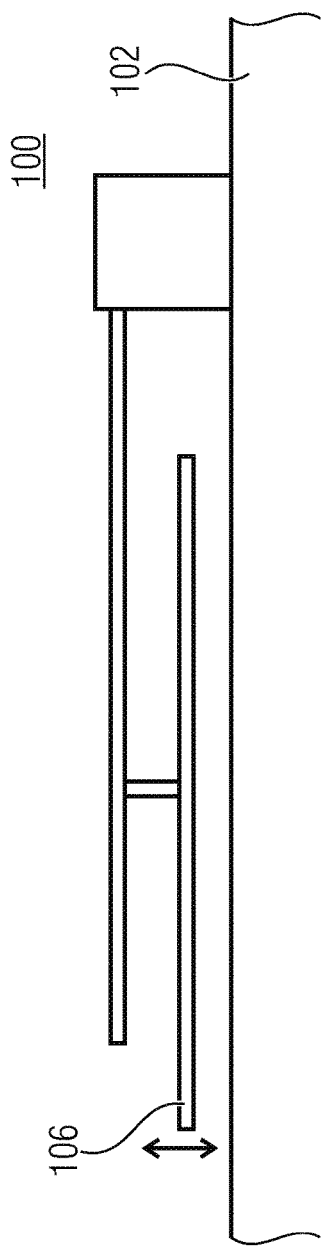
Fig. 2a
Fig. 2b

MEMS ACTUATOR, SYSTEM HAVING A PLURALITY OF MEMS ACTUATORS, AND METHOD FOR PRODUCING A MEMS ACTUATOR

CROSS-REFERENCE TO RELATED APPLICATIONS

This application is a continuation of copending International Application No. PCT/EP2016/050465, filed Jan. 12, 2016, which is incorporated herein by reference in its entirety, and additionally claims priority from German Application No. 10 2015 200 626.3, filed Jan. 16, 2015, which is also incorporated herein by reference in its entirety.

Embodiments of the present invention relate to an MEMS actuator (MEMS=micro-electro-mechanical system). Further embodiments relate to a system comprising a plurality of MEMS actuators. Further embodiments relate to a method for producing an MEMS actuator. Some embodiments relate to a parallel deflecting MEMS actuator with unilateral suspension. Some embodiments relate to the design of an MEMS actuator.

BACKGROUND OF THE INVENTION

MEMS actuators can, for example, be used for moving a micro-mirror connected therewith and to position the same as desired. Such actuators are increasingly used for a wide scale of applications, such as spatial light modulators, scanner mirrors, optical cross-connects, microvalves, electric microswitches and others.

Usually, the position of a movable actuator part is controlled by an applied electric signal. In many cases, electrostatic attraction is used as physical effect, but also electromagnetic forces as well as piezoelectric or thermal expansion can be used. The invention is particularly advantageous for micro-mechanical actuators that are controlled electrostatically or electromagnetically and that have a resetting elastic suspension applying a respective counteracting force for static equilibrium deflection.

Due to the type of movement to be carried out, a differentiation can be made between rotating/tilting actuators and translational actuators as well as actuators allowing both types of movement. In the latter case, the movement components can either be firmly coupled by the type of suspension or can be individually adjusted by several control signals (e.g., piston-tip-tilt). The type of movement as well as the necessitated deflection is usually predetermined by physical parameters and boundary conditions of the application. This can, for example, be the wavelength of the light to be modulated or the angular range of a scanner.

Frequently, the above described actuators are densely packed on a carrier substrate in large numbers, in particular when the same are coupled to micromirrors. The shape and size of the mirrors is usually limited by the application and optical boundary conditions. The same determines the available space for the structural design of the elastic suspension and the springs of the actuator, respectively. Apart from the springs, their mounts, i.e. the posts, have to be accommodated on this limited area as well.

In the conventional MEMS actuators for translational movements, springs are used whose geometry has such a symmetry that clearly no undesired tilt can occur during deflection.

In square (or rectangular) arrangements, usually four, sometimes also only two similar springs are used, in hexagonal mirrors frequently three, sometimes also six similar springs. These spring arrangements also have a respective manifold rotational symmetry, frequently also one or several mirror symmetries. Conventionally, an at least two-fold rotational symmetry exists. This also induces that at least two anchor points or posts exist to which one end of at least one spring is connected.

Here, basically, several springs can be mounted on each post, but then these springs are electrically connected. Since the springs also form the electrical supply to the movable actuator part, all actuators have the same electric potential, which is not desirable here.

For individual electrical addressing of the actuators several posts would be needed per actuator. In connection with the smallest manufacturable structural sizes and layer thicknesses, the remaining space frequently allows only springs that are relatively rigid compared to the realizable addressing forces.

If an actuator is suspended with springs at several posts, a production-induced or thermal stress in the spring plane can significantly influence the spring constant. This effect is particularly strong when the springs run in a radial and straight manner. Then, the stress that has been introduced or that has been caused thermally cannot relax. Additionally, the spring force runs in a strong non-linear manner, since the distance between post suspension and actuator increases with increasing deflection and the spring is hence extended. This non-linearity can also be advantageous, see [Peter Dürr, Andreas Gehner, Jan Schmidt, Detlef Kunze, Michael Wagner, Hubert Lakner: "Micro-actuator with extended analog deflection at low drive voltage", Proceedings of SPIE Vol. 6114 (2006)], but the simultaneous dependency on the layer stress frequently makes this spring geometry uncontrollable. Thus, in conventional technology, usually folded or bent springs are used for translational mirrors, or springs that are more in an azimuthal direction, e.g., [Andreas Gehner et al.: "MEMS analog light processing—an enabling technology for adaptive optical phase control", Proc. of SPIE Vol. 6113, 61130K, (2006)]. Thereby, the stress dependency of the spring constant as well as the non-linearity becomes smaller but does not disappear completely. It is also possible that springs are extended further than the mirror suspended from the same, see, e.g., [D. Lopez et al.: "Two-dimensional MEMS array for maskless lithography and wave-front Modulation", Proc. of SPIE Vol. 6589, 65890S, (2007)] but the area available per pixel remains unaffected by that.

From U.S. Pat. No. 4,566,935, asymmetrical spring arrangements are known, these are then intended for tilt movement modes and are not suitable for mere parallel translation. Further, an approach where the translation is superposed by tilt is known from [Richard Stahl et al.: "Modular sub-wavelength diffractive light modulator for high-definition holographic displays", Journal of Physics: Conference Series 415 (2013)].

SUMMARY

According to an embodiment, an MEMS actuator may have: a substrate; at least one post attached to the substrate; and a deflectable actuator body connected to the at least one post via at least one spring, wherein, during electrostatic, electromagnetic or magnetic force application, the actuator body takes a second position starting from a first position by a tilt-free translational movement, wherein the first position and the second position are different; and wherein in a top view of the MEMS actuator at least 90% of the actuator body and a centroid of the actuator body are arranged outside an area, wherein, with at least two posts, the area is an area spanned by the at least two posts, and wherein, with exactly one post, the area is an area of the post.

According to another embodiment, a system may have: a plurality of inventive MEMS actuators, wherein the MEMS actuators include a common substrate.

According to another embodiment, a method for operating an MEMS actuator, wherein the MEMS actuator includes a substrate, at least one post attached to the substrate and a deflectable actuator body connected to the at least one post via at least one spring, wherein in a top view of the MEMS actuator at least 90% of the actuator body and a centroid of the actuator body are arranged outside an area, wherein, with at least two posts, the area is an area spanned by the at least two posts, and wherein, with exactly one post, the area is an area of the post, may have the steps of: applying an electrostatic, electromagnetic or magnetic force to the deflectable actuator body, wherein, during electrostatic, electromagnetic or magnetic force application, the actuator body takes a second position starting from a first position by a tilt-free translational movement, wherein the first position and the second position are different.

According to another embodiment, a method for producing an MEMS actuator may have the steps of: providing a substrate; providing at least one post, wherein the at least one post is attached to the substrate; providing a deflectable actuator body; providing at least one spring; wherein the deflectable actuator body is connected to the at least one post via the at least one spring, wherein in a top view of the MEMS actuator at least 90% of the actuator body and the centroid of the actuator body are arranged outside an area, wherein, with at least two posts, the area is an area spanned by the at least two posts, and wherein, with exactly one post, the area is an area of the post, and wherein, during electrostatic, electromagnetic or magnetic force application, the actuator takes a second position starting from a first position by a tilt-free translational movement, wherein the first position and the second position are different.

Embodiments of the present invention provide an MEMS actuator comprising a substrate, at least one post attached to the substrate and a deflectable actuator body connected to the at least one post via at least one spring, wherein, during electrostatic, electromagnetic or magnetic force application, the actuator body takes a second position starting from a first position by a tilt-free translational movement, wherein the first position and the second position are different and wherein, in a top view on the MEMS actuator, the actuator body is arranged outside an area spanned by the at least one post.

Further embodiments provide a system comprising a plurality of MEMS actuators, wherein the MEMS actuators comprise a common substrate and at least one post each attached to the substrate and a deflectable actuator body connected to the at least one post via at least one spring, wherein, during electrostatic, electromagnetic or magnetic force application, the actuator body takes a second position starting from a first position by a tilt-free translational movement, wherein the first position and the second position are different and wherein, in a top view of the respective MEMS actuator, the actuator body is arranged outside an area spanned by the at least one post.

Further embodiments provide a method for producing an MEMS actuator. The method includes providing a substrate, providing at least one post, wherein the at least one post is attached to the substrate, providing a deflectable actuator body and providing at least one spring, wherein the deflectable actuator body is connected to the at least one post via the at least one spring, wherein in a top view of the MEMS actuator the actuator body is arranged outside an area spanned by the at least one post, and wherein the actuator body, during electrostatic, electromagnetic or magnetic force application, takes a second position starting from a first position by a tilt-free translational movement, wherein the first position and the second position are different.

BRIEF DESCRIPTION OF THE DRAWINGS

Embodiments of the present invention will be detailed subsequently referring to the appended drawings, in which:

FIG. 1a is a schematic top view of an MEMS actuator comprising an actuator body connected to only one post via only one spring, according to an embodiment of the present invention;

FIG. 1b is a schematic cross-sectional view of the MEMS actuator shown in FIG. 1a according to an embodiment of the present invention;

FIG. 2a is a schematic top view of an MEMS actuator comprising an actuator body connected to two posts via one spring according to an embodiment of the present invention;

FIG. 2b is a schematic cross-sectional view of the MEMS actuator shown in FIG. 2a according to an embodiment of the present invention;

DETAILED DESCRIPTION OF THE INVENTION

Figure 3:
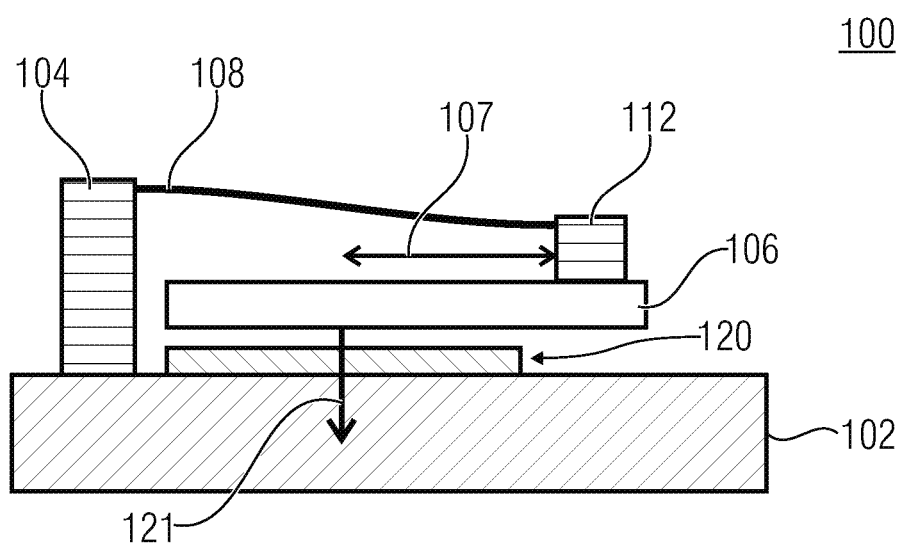
FIG. 3 is a schematic cross-sectional view of an MEMS actuator comprising a unilaterally suspended actuator body according to an embodiment of the present invention.

In the following description of the embodiments of the invention, the same or equal elements are provided with the same reference numbers in the figures, such that their description is inter-exchangeable in the different embodiments.

FIG. 1a shows a schematic top view of an MEMS actuator 100 while FIG. 1b shows a schematic cross-sectional view of the MEMS actuator 100 shown in FIG. 1a. The MEMS actuator 100 includes a substrate 102, a post 104 attached to the substrate 102 and a deflectable actuator body 106 connected to the post 104 via only one spring 108, wherein, during electrostatic, electromagnetic or magnetic force application, the actuator body 106 takes a second position starting from the first position by a tilt-free translational movement, wherein the first position and the second position are different, and wherein in a top view of the MEMS actuator, as can be seen in FIG. 1a, the actuator body 106 is arranged outside an area 110 spanned by the post 104 which is limited by the dotted lines in FIG. 1a.

The MEMS actuator 100 can, for example, comprise a driving means that is configured to cause the electrostatic, electromagnetic or magnetic force application to the deflectable actuator body.

Although the MEMS actuator 100 shown in FIGS. 1a and 1b comprises an actuator body 106 that is connected to only one post 104 via only one spring 108, it should be noted that the invention is not limited to such embodiments.

In embodiments, the MEMS actuator 100 can comprise up to n posts 104_1 to 104_n, wherein n is a natural number greater than or equal to 1, n≥1. Thus, the MEMS actuator 100 can comprise at least one post attached to the substrate and a deflectable actuator body connected to at least one post via at least one spring, wherein in a top view of the MEMS actuator, the actuator body 106 is arranged outside the area 110 spanned by the posts 104_1 to 104_n.

For example, as shown in FIGS. 2a and 2b, the MEMS actuator 100 can comprise two posts 104_1 and 104_n (n=2). As can be seen in FIG. 2a, also in this case, the actuator body 106 is arranged outside the area 110 spanned by the two posts 104_1 and 104_n (n=2), which is limited by the dotted lines.

The actuator body 106 can be connected to each of the n posts 104_1 or 104_n via one spring. Here, the spring 108 can comprise several spring elements (or spring portions), wherein the actuator body 106 can be connected to the n posts 104_1 or 104_n via different spring elements.

In FIGS. 2a and 2b, the actuator body 106 is connected to each of the two posts 104_1 and 104_n (n=2) via a spring 108, wherein the spring 108 comprises exemplarily four spring elements (or spring portions) 108_1 to 108_4, wherein a first spring element 108_1 is serially connected between the post 104 and a fourth spring element 104_4 that is implemented as connecting spring element, wherein a second spring element 108_2 is serially connected between the second post 104_2 and the fourth spring element 104_4, and wherein a third spring element is serially connected between the connecting spring element 108_4 and the actuator body 106.

In FIGS. 1a and 1b the spring 108 also comprises, exemplarily, four spring elements 108_1 to 108_4, wherein here both the first spring element 108_1 and the second spring element 108_2 are connected to the (same) post 104.

Although the actuator body 106 is arranged outside the area 110 spanned by the at least one post in a top view of the MEMS actuator 100, the actuator body 106 takes, during electrostatic, electromagnetic or magnetic force application, a second position starting from a first position by a tilt-free translational movement. Here, a tilt-free translational movement means a translational movement with a tilt (around a tilt axis) by less than 3°, 1°, 0.5° or 0.1°. Further, the tilt-free translational movement can relate to the fact that the movement amplitude of each individual point of the actuator body differs at the most by 10%, 5% or 2% from the average movement amplitude. Further, the tilt-free translational movement can relate to a fundamental mode of the vibration and vibrational movement, respectively, caused by the electrostatic, electromagnetic or magnetic force application.

The actuator body 106 can perform, for example, a tilt-free translational movement parallel to the direction of the force application. For example, the actuator body 106 can be an actuator plate, wherein the direction of the force application runs perpendicular to the actuator plate 106. In this case, the actuator plate 106 can perform a tilt-free translational movement parallel to a direction perpendicular to the actuator plate 106.

This is enabled by a suitable dimensioning of the movement-relevant parameters of the MEMS actuator 100. For example, analytic calculations or simulations can be performed, wherein at least one of the movement-relevant parameters of the MEMS actuator 100 is adapted until the actuator body 100 takes, during electrostatic, electromagnetic or magnetic force application, a second position starting from the first position by a tilt-free translational movement. The movement relevant parameters of the MEMS actuator 100 are, for example, among others, a geometry of the deflectable actuator body 106, a position of the post 104 relative to the actuator body 106, a geometry of the spring 108, an arrangement of a connecting point between spring 108 and posts 104, a position of the post 104, a lever-arm actuator force-connection of the actuator to a spring and/or an arrangement of a connecting point between spring 108 and deflectable actuator body 106.

The spring 108 can comprise, for example, a constant or variable cross-section course along the connection between actuator body 106 and post 104. Further, the spring 104 can comprise a variable rigidity along the connection between actuator body 106 and post 104.

As can be seen in FIG. 1b, the actuator body 106 can be connected to the spring 108 (e.g. via a connecting element 112) in an area that is small compared to the main surface 114 of the actuator body 106. Obviously, the actuator body 106 can also be connected to one spring or several springs via several connecting elements 112. In embodiments, the actuator body 106 is connected to the at least on spring 108 only in a contiguous area 116 of the main surface 114 of the actuator body 106 that is not greater than 30% (or 20% or 10%) of the main surface 114 of the actuator body 106. The contiguous area 106 can, for example, be square or circular. Further, a center of the contiguous area 106 can coincide with a center of the actuator plate 106.

In the following, embodiments of the present invention will be described where the actuator body 106 is connected to only one post 104 via only one spring 108.

Embodiments of the present invention solve the problems stated in the introductory part of the description by using only one anchor point or post 104 per actuator 106 and the usage of a respective asymmetrical spring and/or actuator geometry which is, however, designed such that the actuator 106 still performs a pure translation movement without undesired tilt. By the suspension on only one post 104, a possible production-induced layer tension in the spring 108 can relax and the stiffening of the spring 108 with increasing deflection is prevented. In the deflected state, the part of the spring 108 connected to the post 104 will have, at first, an inclination (angle to the resting position plane) increasing with the distance from the post 104. In the further course of the spring 108, this inclination can decrease again, when the forces acting on the end of the spring 108 transfer a respective torque.

According to an embodiment of the present invention, this can result by an asymmetrically arranged actuator 106, whose point of application of force is closer to the post 104 than its connection to the spring 108 as shown in FIG. 3.

In detail, FIG. 3 shows a schematic cross-sectional view (schematic diagram) of an MEMS actuator 100 with a unilaterally suspended deflected actuator and actuator body 106, respectively, without tilt. As shown exemplarily in FIG. 3, the actuator body 106 can be an actuator plate, wherein the MEMS actuator 100 further comprises an electrode plate 120 (or address electrode) opposing the actuator plate 106. Here, the MEMS actuator 100 can be configured to exert electrostatic force application 121 on the actuator plate 106 via the electrode plate 120. Instead of the electrode plate 120, the MEMS actuator 100 can also comprise a coil opposing the actuator plate 106.

The spring 108 can comprise a spring element that is twice as long as a lever arm 107 between a centroid of the actuator body 106 or a centroid of the forces acting on the actuator body 106 and a connecting point where the actuator body 106 is connected to the spring 108 or to the spring 108 via a connecting element 112.

With a short lever arm, the actuator 106 will tilt away from the post 104 during deflection (positive tilt), with a very long lever arm, the actuator 106 will tilt towards the post 104 (negative tilt). Between that, due to continuity there is necessarily the desired zero-point of tilt.

For a simple spring 108 having a square cross-section constant across the length it can be seen that this zero-point is reached with a lever arm corresponding to half the spring length. Additional degrees of freedom for relative positioning of the post 104 and the actuator 106 can be obtained when the cross-section of the spring 108 is not necessarily to be constant. Generally, the position of the desired zero-point of tilt of the actuator 106 depends on the exact geometry of the spring 108 and its mount on both ends. The same can also be limited to the desired accuracy with the help of numerical simulations.

This zero point of tilt is maintained for the various deflections as long as the spring 108 is loaded in its linear range (Hooke's Law).

Figure 4A:
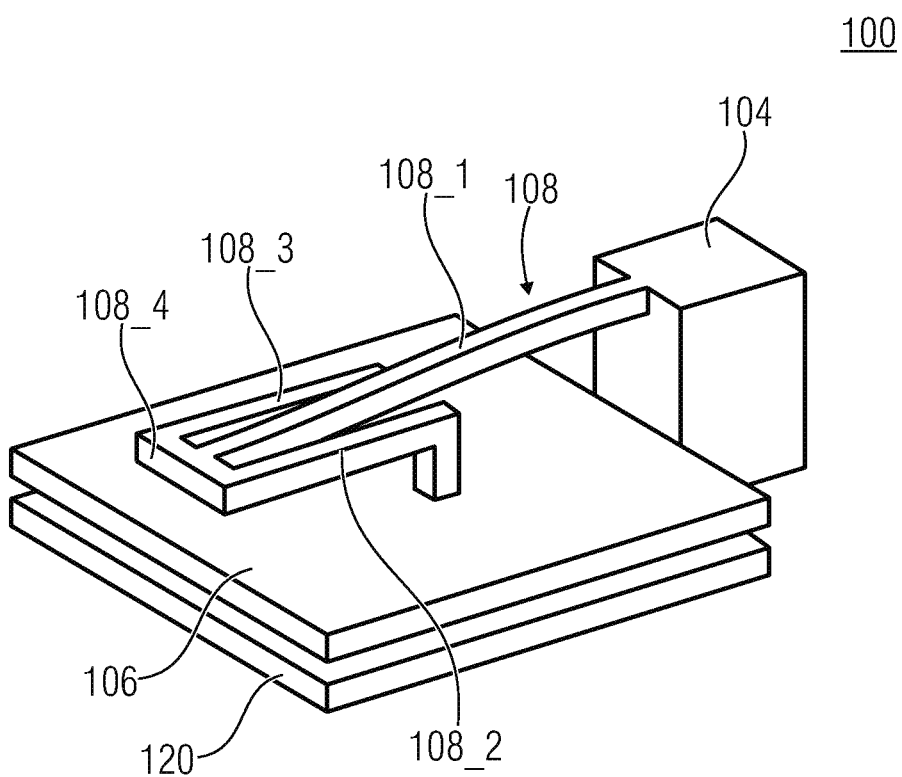
FIG. 4a is a schematic perspective view of an MEMS actuator comprising an actuator body connected to only one post via only one spring according to an embodiment of the present invention.
Figure 4B:
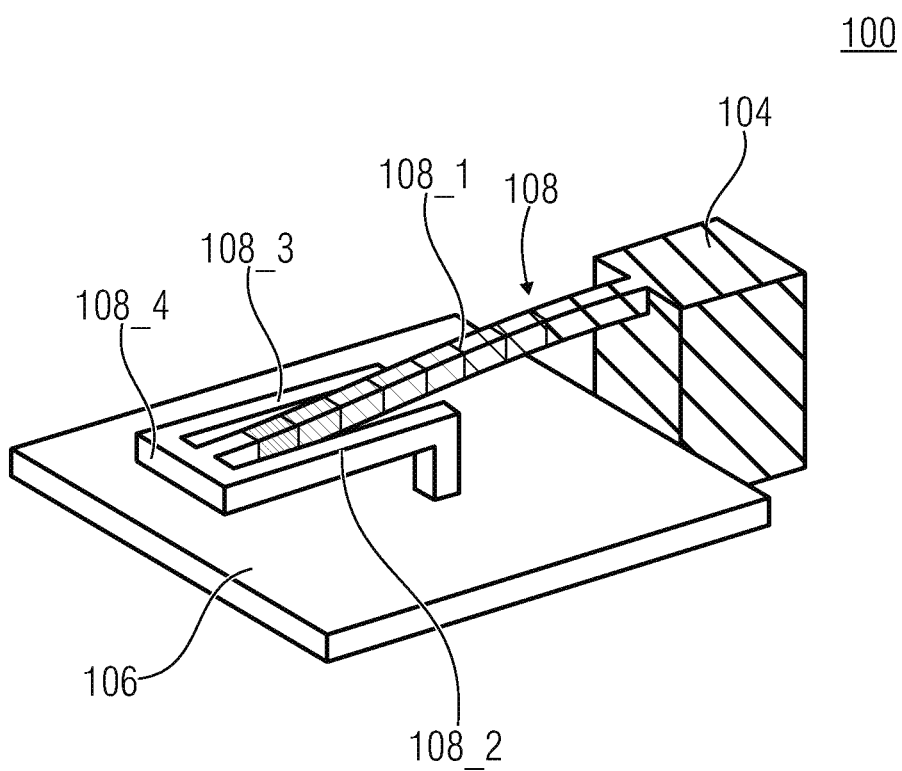
FIG. 4b is a schematic view of the MEMS actuator shown in FIG. 4a in an FEM simulation environment.

A further implementation of the invention allows arranging the actuator 106 symmetrically to its connection with the spring 108, or such that the resulting actuator force acts on that connection. Then the actuator 106 does not transmit a torque at the interface to the spring 108 but, due to its suitable design, tilt can still be prevented. However, for this, apart from at least a first spring portion starting from the post 104, at least one further part is needed that is directed from the end of the first part more or less back in the direction of the post 104. Two exemplary implementations are shown in FIG. 4a (with two second spring parts) and FIG. 5a (with only one second spring part). The FEM simulation (ANSYS, a finite element software) results, as desired, in a negligible tilt independent of the deflection.

FIG. 4a shows a perspective view of an MEMS actuator 100 in detail, wherein the actuator body 106 is connected to only one post 104 via only one spring 108. The spring 108 comprises at least a first spring element 108_1 and a second spring element 108_2 that is shorter than the first spring element 108_1, wherein the first spring element 108_1 is connected to the post 104 and extends essentially away from the post 104, and wherein the second spring element 108_2 is connected to an end of the first spring element 108_1 facing away from the post 104 (e.g. via a connecting spring element 108_4) and essentially extends towards the post 104. The spring 108 can further comprise a third spring element 108_3 that is also shorter than the first spring element 108_1 (or of exactly the same length as the spring element 108_2, respectively), wherein the third spring element 108_3 is also connected to an end of the first spring element 108_1 facing away from the post 104 (e.g. via the connecting spring element 108_4) and essentially extends towards the post 104.

Figure 5A:
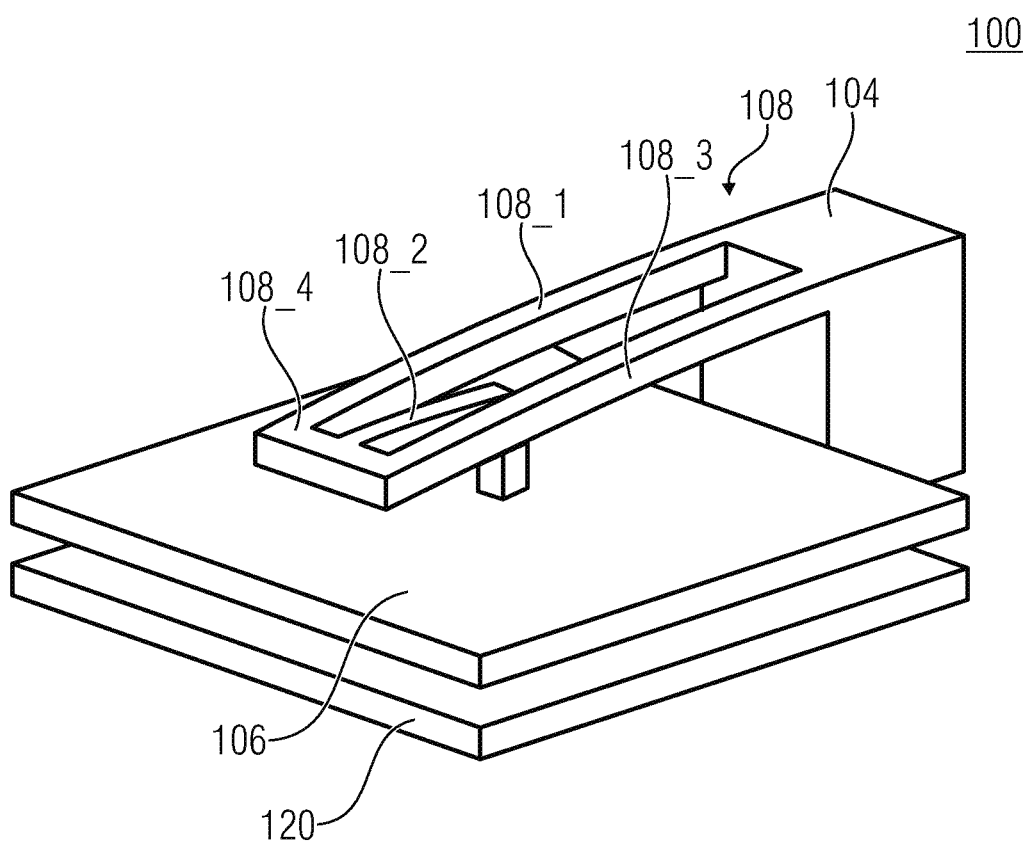
FIG. 5a is a schematic perspective view of an MEMS actuator comprising an actuator body connected to only one post via only one spring according to an embodiment of the present invention.
Figure 5B:
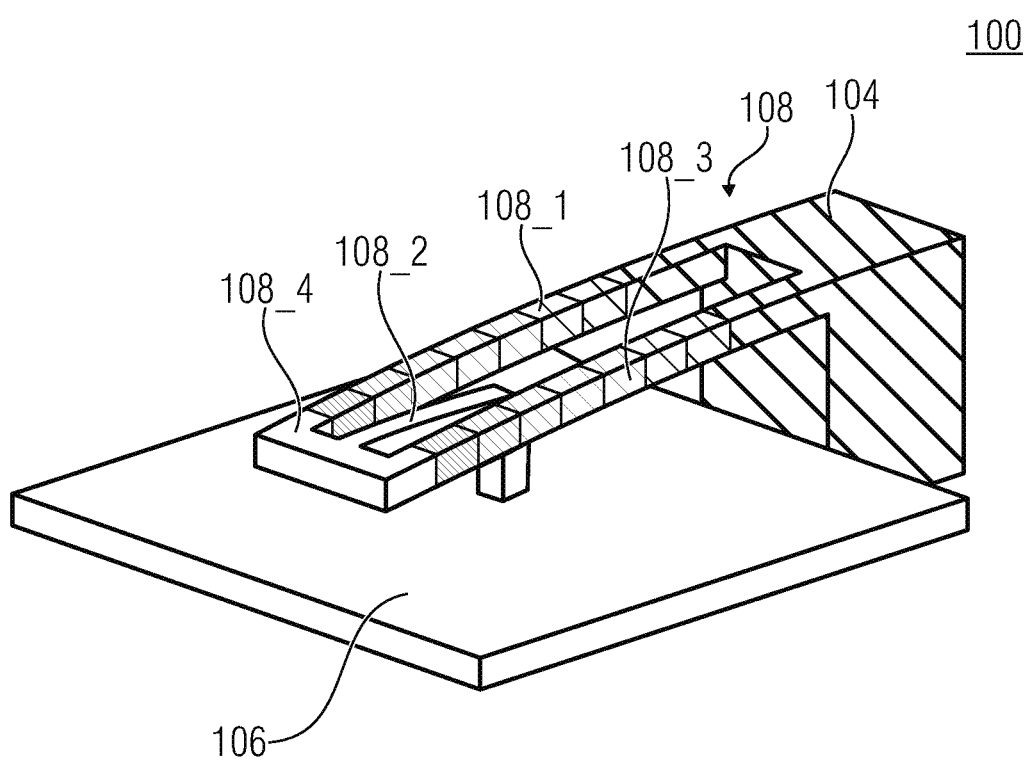
FIG. 5b is a schematic view of the MEMS actuator shown in FIG. 5a in an FEM simulation environment.

FIG. 5a shows a perspective view of an MEMS actuator 100, wherein the actuator body 106 is connected to only one post 104 via only one spring 108. The spring 108 comprises at least a first spring element 108_1 and a second spring element 108_2 that is shorter than the first spring element 108_1, wherein the first spring element 108_1 is connected to the post 104 and extends essentially away from the post 104, and wherein the second spring element 108_2 is connected to an end of the first spring element 108_1 facing away from the post 104 (e.g. via a connecting spring element 108_4) and essentially extends towards the post 104. Further, the spring 108 can comprise a third spring element 108_3, wherein the third spring element 108_3 is also connected to the post 104 and essentially extends away from the post 104, and wherein the second spring element 108_2 is connected to an end of the spring element 108_3 facing away from the post 104 (e.g. via a connecting spring element 108_4).

In FIGS. 4a and 5a, the first and second spring elements 108_1 and 108_2 (and the third spring element 108_3) can run parallel to one another at least in one deflection state of the actuator body 106 (e.g. in the non-deflected state of the actuator body 106).

Similar to the lever arm of the actuator in FIG. 3, the second spring part 108_2 generates a torque at the interface to the first part 108_1 which reduces the inclination of the same at the end. Additionally, the angle relative to the resting position plane will decrease along the second spring part 108_2. With a respective soft second spring part 108_2, the same could also become negative (towards the post 104). By a suitable selection of the spring parameters (length, width and thickness of both parts), the zero point of the tilt of the actuator 106 can be found again. If in a desired configuration, e.g., a tilt of the actuator 106 away from the post 104 is determined, this can be eliminated by a spring 108 that is softer in its second part 108_2, e.g. by a reduced width.

Generally, for designing an actuator 100 with a complicated geometry, it may not be obvious whether the movement will be tilt-free. With the help of FEM simulations, this can be tested and the design can be systematically optimized as will be discussed below based on FIG. 6.

Figure 6:
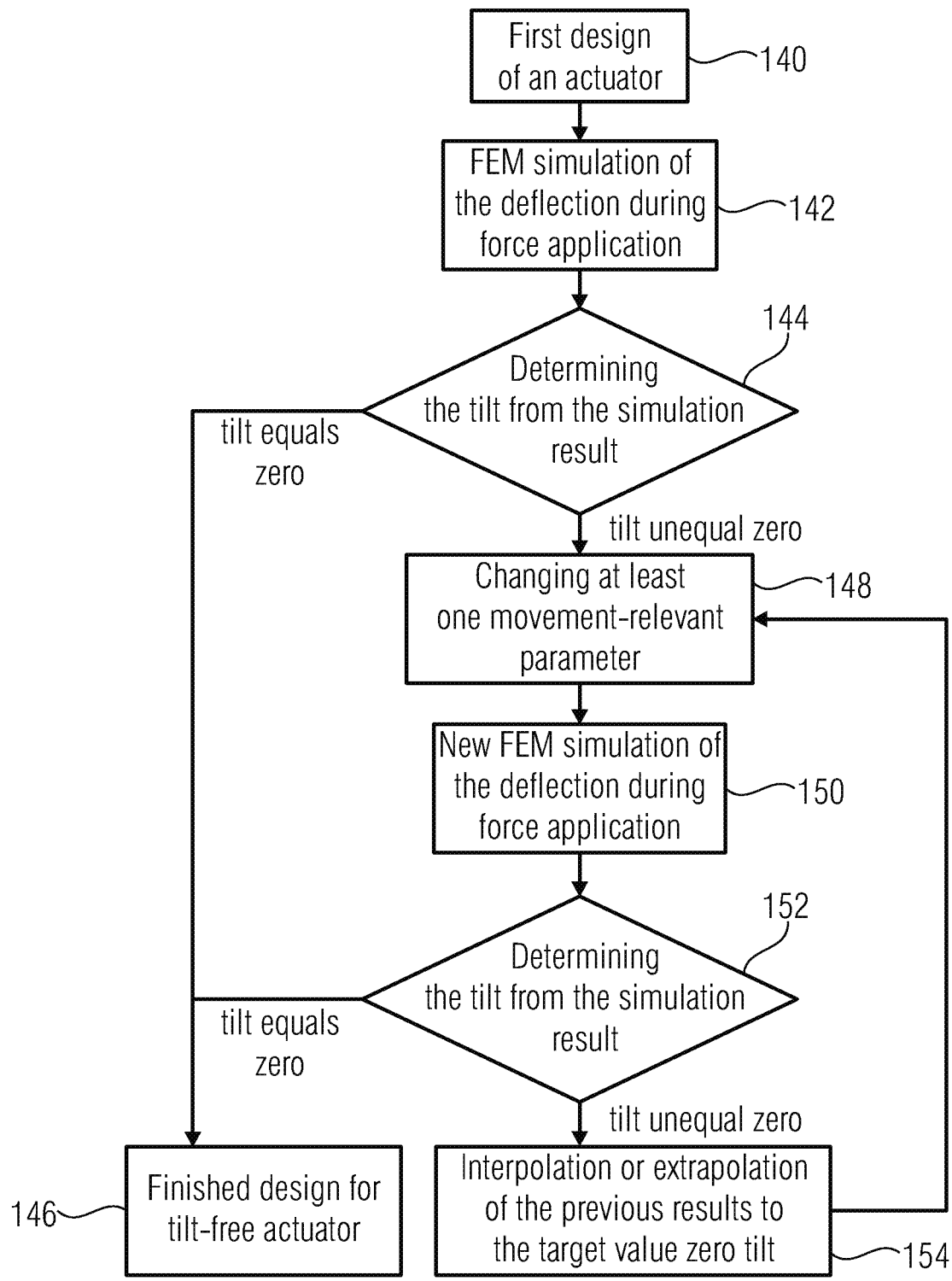
FIG. 6 is a flow diagram of a method for producing or designing an MEMS actuator according to an embodiment of the present invention.

FIG. 6 shows a flow diagram of a method for producing and designing, respectively, an MEMS actuator 100 that takes, during electrostatic, electromagnetic or magnetic force application, a second position starting from a first position by a tilt-free translational movement, wherein the first position and the second position are different. In a first step 140, a first design of the MEMS actuator 100 can be created. In a second step 142, an FEM simulation of the deflection of the MEMS actuator 100 and the actuator body 106 of the MEMS 100, respectively, during force application can be performed. In a third step 144, a tilt can be determined from the simulation result. As long as no tilt is determined for the first design of the MEMS actuator 100, the design for the tilt-free MEMS actuator 100 is finished, which is shown in FIG. 6 by a fourth step 146. As long as a tilt is determined for the first design of the MEMS actuator 100, in a fifth step 148, at least one of the movement-relevant parameters can be changed and the simulation can be performed again in a sixth step 150. In a seventh step 152, a tilt can be determined from the simulation result. As long as no tilt is determined for the second design of the MEMS actuator 100, the design for the tilt-free MEMS actuator 100 is finished, which is shown in FIG. 6 by the fourth step 146. As long as a tilt is determined for the second design of the MEMS actuator 100, in an eighth step 154, a new value for the previously changed movement-relevant parameter can be interpolated (or extrapolated, depending on the signs of the results) from the change of the simulated tilt, which ensures a negligible tilt.

Subsequently, steps 148, 150, 152 and possibly 154 can be repeated for the third and any further design of the MEMS actuator 100 until the tilt is zero and a finished design is obtained for a tilt-free MEMS actuator 100 in step 146. This should result in a design having the desired characteristics in a few iteration steps.

Although above first and second spring parts 108_1 and 108_2 have been mentioned, it is not decisive for the function of the invention that these two parts show a clear separation. The same can also merge into one another. Obviously, implementations that have more than only two spring parts are possible, as can be seen in FIGS. 4a, 4b, 5a and 5b (1: away from the post (first spring element 108_1) 2: transverse to the symmetry axis (connecting spring element 108_4) 3: in the direction of the post (second spring element 108_3)). The above examples still have mirror symmetry along the line post-connection of anchor and spring. Due to this symmetry, a tilt transversal to this direction as above is impossible (stable equilibrium assumed) and has hence not been discussed. For realizing a spring 108 that is as soft as possible, this symmetry is disadvantageous, since for the double implementation of the first or second spring part 108_1 or 108_2, the resulting spring 108 becomes harder. What is more, without the space requirements of these double spring parts, an individual spring could be implemented in a longer and hence softer manner. A possible solution with first and second spring parts in two different production planes is usually not desirable due to the involved additional production complexity and costs.

Actually, there are also solutions that do not comprise this symmetry. Thereby, the available space can be used optimally for a spring that is as soft and long as possible, if desired. In the following, based on FIG. 7, a simple specific case for the asymmetrical case will be discussed.

Figure 7:
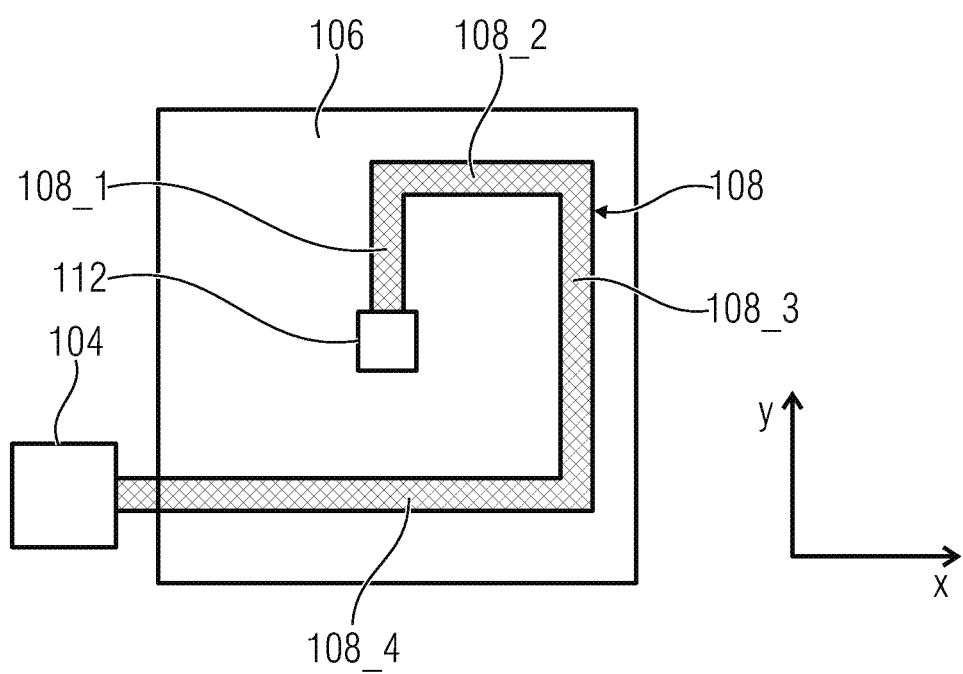
FIG. 7 is a schematic top view of an MEMS actuator comprising an actuator body connected to only one post via a spiral spring according to an embodiment of the present invention.

In detail, FIG. 7, shows a schematic top view of an MEMS actuator 100 comprising an actuator body 106 that is connected to only one post 104 via only one spring 108. The spring 108 has no symmetry within the plane of its resting position. This can relate to mirror symmetries and to rotations. However, mirror symmetry at the horizontal center plane of the spring can be allowed and is almost inevitable in surface micro mechanics.

As can been seen in FIG. 7, the spring 108 can be spiraled. Further, the spring 108 can comprise a plurality of spring elements 108_1 to 108_4 that extend in different directions, wherein at least a first spring element 108_1 of the plurality of spring elements 108_1 to 108_4 that extends in a first direction is configured to prevent a tilt of the actuator body 106 around a first axis (e.g. x axis), and wherein at least one second spring element 108_2 of the plurality of spring elements 108_1 to 108_4 that extends in the second direction is configured to prevent a tilt of the actuator body around a second axis (e.g. y axis).

In other words, FIG. 7 shows as an example a four-part spring 108 whose parts 108_1 to 108_4 are each at a right angle to one another. Analogously to the above argumentation, in the geometry shown in FIG. 7, by selecting a suitable rigidity (width/length) of the second spring part and spring element 108_2, respectively, (counted from the post, the third spring part) the tilt around the y axis can be reduced to zero as well as by independently selecting the rigidity of the first spring part and spring element 108_1, respectively (counted from the post, the fourth spring part) the tilt around the x axis. There is definitely a solution when the tilt of the corner between the second and third spring part sand spring elements 108_2 and 108_3, respectively, (counted from the post, the second and third spring part) around both axes points away from the post 104. This will at least be the case for relatively short first and second spring parts and spring elements 108_1 and 108_2, respectively (counted from the post, third and fourth spring parts), as can be easily considered in the limiting case of negligible lengths.

Figure 8A:
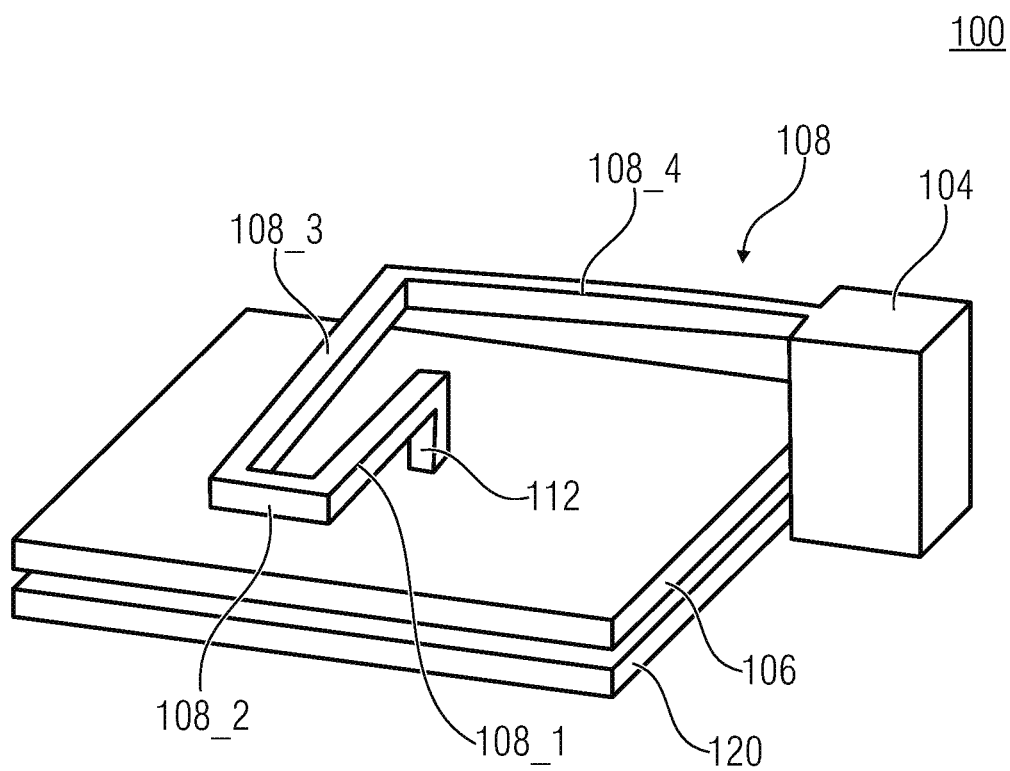
FIG. 8a is a schematic perspective view of an MEMS actuator comprising an actuator body connected to only one post via a spiral spring according to an embodiment of the present invention.
Figure 8B:
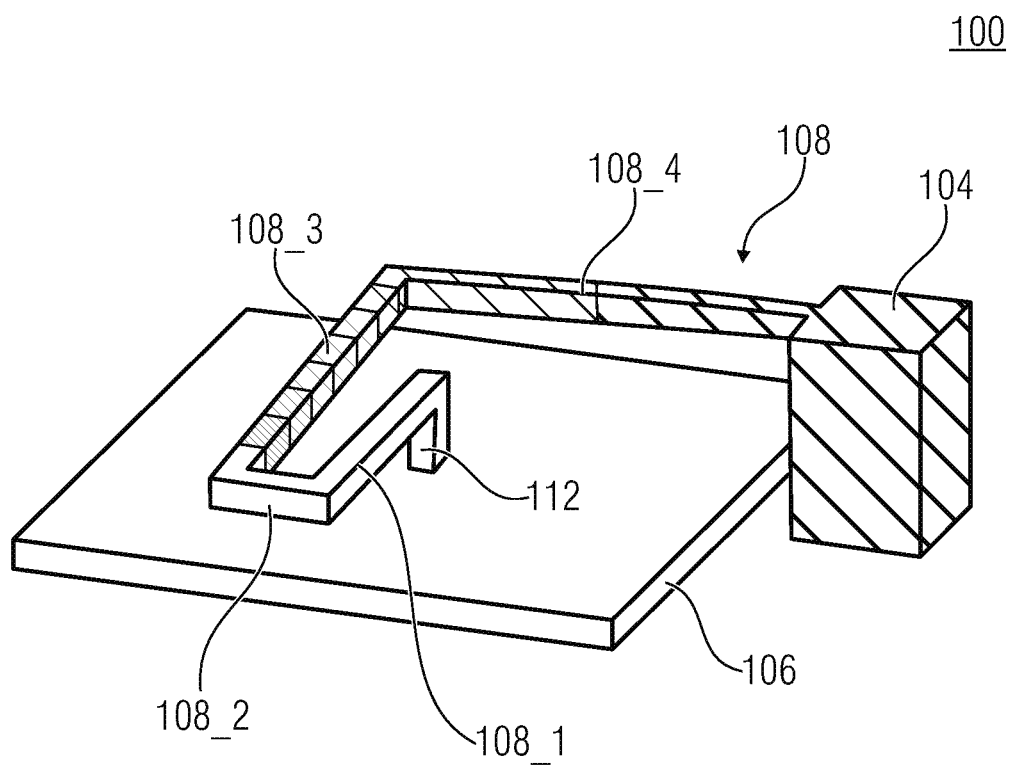
FIG. 8b is a schematic view of the MEMS actuator shown in FIG. 8a in an FEM simulation environment.

FIGS. 8a and 8b show a more realistic example. This is the result of a geometry optimization with the help of FEM simulations (ANSYS) similar to the above-described line of thought but now with constant spring width and thickness which has advantages as regards to production. Here, the resulting tilt is again practically zero as desired, independent of the deflection.

The previous statements all related to the static deflection of the actuator 106, wherein the typically electrostatic or electromagnetic control forces are in a (stable) equilibrium with the spring force. In order for no substantial tilt to occur, even with a fast dynamic change of the deflection up to reaching the new static equilibrium state, the mass of all movable parts can be suitably distributed. Here, it is the easiest case when the mass of the spring can be neglected. Then, the desired case without dynamic tilt results when the mass centroid of all movable parts is such that its connecting line to the centroid of the forces acting on the actuator is parallel to the deflection direction. When this is not fulfilled in the first design, this can be obtained by suitable recesses or add-ons at the actuator or parts connected therewith (e.g. mirrors) or also by lateral displacement of these parts.

When the mass of the springs 108 cannot be neglected, an imbalance would result when maintaining the above condition, due to the unilateral connection to the actuator. When calculating the needed compensation, the mass elements of the spring 108 could be weighted with the respective amplitude of their movement. For determining this amplitude, again the FEM simulation (FEM=finite element method) of static deflection can be used, since direct calculation is mostly not completely possible for elaborately shaped springs 108.

During movement of the actuator body 106, a centroid of movable elements of the MEMS actuator 100 weighted with its respective movement amplitude can hence run along a main force application vector of the force application. Here, the main force application vector results by superposing the forces and force vectors, respectively, applied to the actuator body. Further, the main force application vector runs through a centroid of the forces applied to the actuator body.

Basically, an actuator 106 can also be excited to other vibration modes, among that some that include dynamic tilts. However, for actuators that are deflectable in a statically stable manner, these modes are typically at significantly higher frequencies and are hence mostly not relevant in practice. Above that, such vibration modes also occur in the MEMS actuators according to known technology.

For simplicity reasons, the above examples each show a square actuator plate 106 that is connected to the spring 108 in its center. This is obviously not mandatory for the function of the invention and in the sense of an arrangement of a plurality of such actuators that is as tight as possible also unfavorable since the post necessitates space. Obviously, the actuator can also be recessed such that the same takes up an area together with the post 104 by which the substrate plane can be parqueted. With respect to the above statements, it is obvious that by suitable optimization still both the static and the dynamic tilt can be prevented. In a particularly advantageous manner, this recess of the actuator 106 can be performed with respect to its own post 104 in order to compensate the imbalance by the mass of the spring 108. The post of the adjacent actuator can then be placed into this recess.

Obviously, the spring 108 can also be arranged below the actuator plate 106. In this case, the actuator plate 106 can also be used directly as a mirror.

In the following, an embodiment of the present invention will be described, wherein the actuator body 106 is connected to two posts 104_1 to 104_n (n=2) via one spring.

Figure 9:
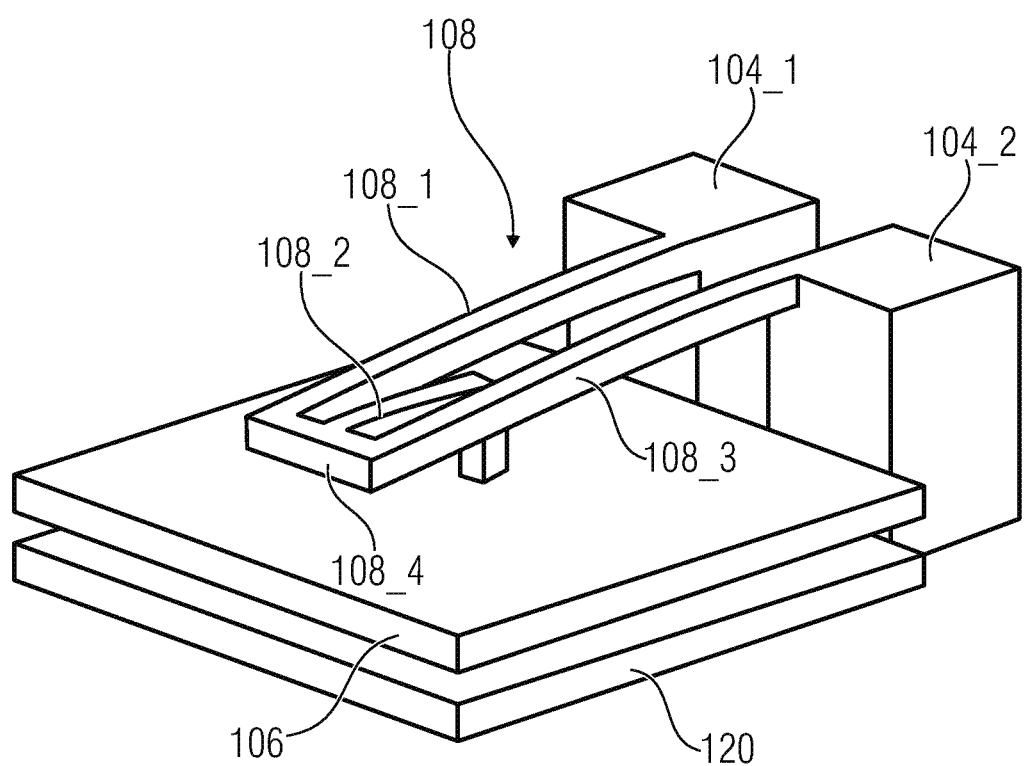
FIG. 9 is a schematic perspective view of an MEMS actuator comprising an actuator body connected to two posts via a spring according to an embodiment of the present invention.

FIG. 9 shows a schematic side view of an MEMS actuator 100 having an actuator body 106 connected to two posts 104_1 to 104_n (n=2) via one spring. The spring 108 comprises a first spring element 108_1, a third spring element 108_3 and a second spring element 108_2 that is shorter than the first spring element 108_1 and the third spring element 108_3, wherein the first spring element 108_1 is connected to the first post 104_1 and essentially extends away from the first post 104_1, wherein the third spring element 108_3 is connected to the second post 104_2 and essentially extends away from the second post 104_2, and wherein the second spring element 108_2 is connected to an end of the first spring element 108_1 facing away from the first post 104_1 (e.g. via a connecting spring element 108_4) and with a second end of the third spring element 108_3 facing away from the second post 104_2 (e.g. via the connecting spring element 108_4) and essentially extends towards the post 104_1 and 104_2.

Figure 10:
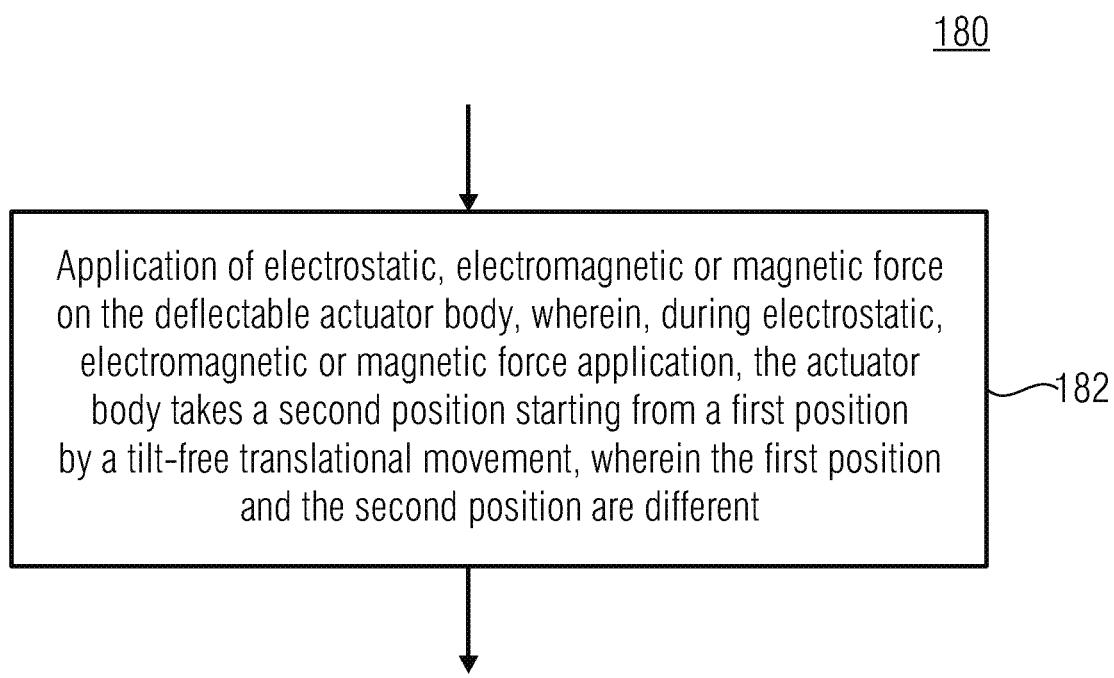
FIG. 10 is a flow diagram of a method for operating an MEMS actuator according to an embodiment of the present invention.

FIG. 10 shows a flow diagram of method 180 for operating an MEMS actuator 100. The method 180 includes a step 182 of applying an electrostatic, electromagnetic or magnetic force to the deflectable actuator body 106, wherein, during electrostatic, electromagnetic or magnetic force application, the actuator body 106 takes a second position starting from a first position by a tilt-free translational movement, wherein the first and second position are different.

Figure 11:
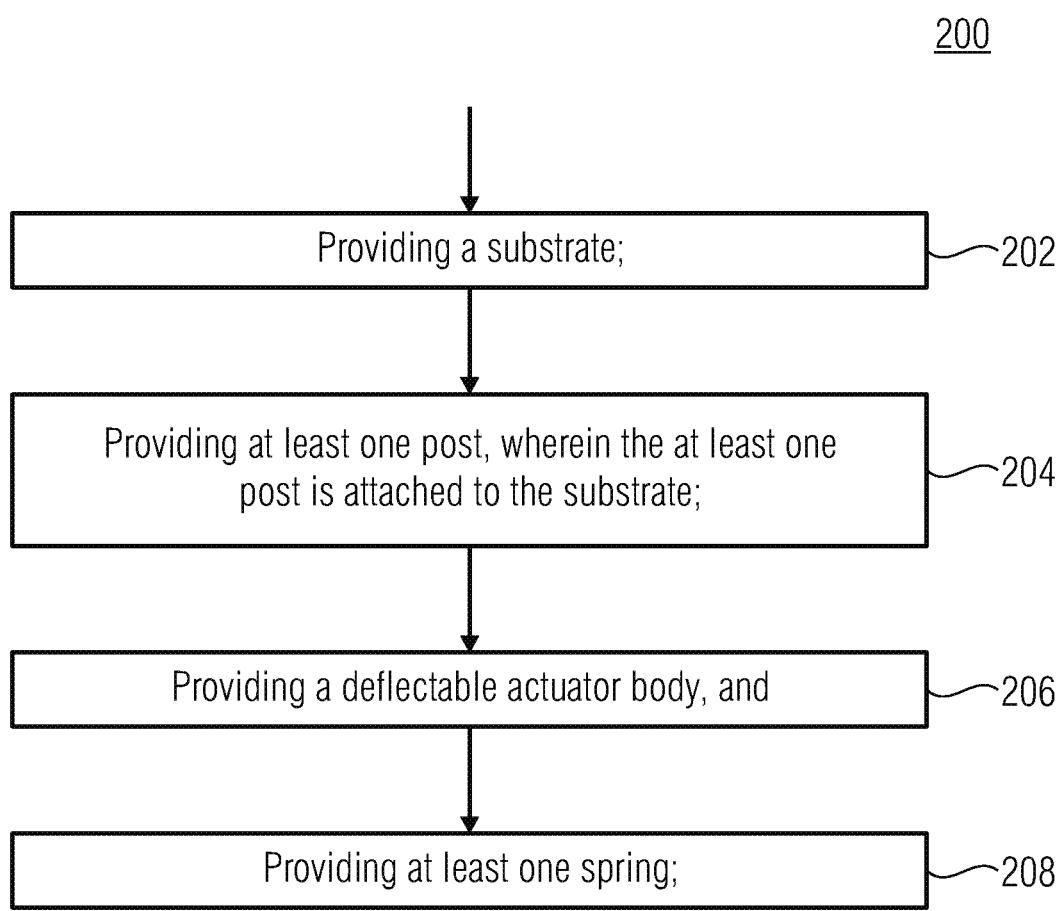
FIG. 11 is a flow diagram of a method for producing an MEMS actuator according to an embodiment of the present invention.

FIG. 11 shows a flow diagram of a method 200 for producing an MEMS actuator 100. The method 200 includes a step 202 of providing a substrate 102, a step 204 of providing at least one post 104, wherein the at least one post 104 is attached to the substrate 102, a step 206 of providing a deflectable actuator body 106 and a step 208 of providing at least one spring 108, wherein the deflectable actuator body 106 is connected to the at least one post 104 via the at least one spring 108, wherein in a top view of the MEMS actuator 100 the actuator body 106 is arranged outside an area 110 spanned by at least one of the posts 104, wherein during electrostatic, electromagnetic or magnetic force application, the actuator body 106 takes a second position starting from the first position by a tilt-free translational movement, wherein the first position and the second position are different.

The method 200 can further include a step of performing simulations of the MEMS actuator 100, wherein when performing the simulations of the MEMS actuator 100 at least one of the movement-relevant parameters of the MEMS actuator 100 is adapted until the actuator body 106 performs a tilt-free translational movement parallel to a direction of the force application during electrostatic, electromagnetic or magnetic force application. Here, at least one of the post 104, the deflectable actuator plate 106 and the spring 108 can be provided in dependence on the movement-relevant parameters.

Embodiments enable asymmetrical suspension of MEMS actuators 100 at only one post 104 and still obtain a tilt-free parallel deflection. Thereby, the frequently very limited space (especially with very small pixel sizes) can be used optimally for soft suspension. By preventing stress stiffening, as it usually occurs during suspension at several posts, the area of the linear spring characteristic (Hooke's Law) can be particularly large.

Embodiments are suitable for micromechanical actuators, in particular for phase-shifting SLMs (SLM=Spatial Light Modulator) with very small pixels (compared to the producible mechanical structural sizes and also to the desired deflection). Such SLMs are particularly suitable for digital holography, both for future holographic displays as well as for (somehow more obvious) applications such as universal laser tweezers and fast optical switches for fiber-optic networks where such SLMs allow the simultaneous splitting as well as control of direction, divergence and intensity of laser rays. But also the usage in other devices for pattern generation seems useful. Above that, a plurality of other applications in micro actuator technology (even without micromirror) as well as sensor technology is possible.

In embodiments, posts and spring can be designed such that the actuator is guided in a purely translational movement and the spring at the same time is as soft as possible and this remains like that even for large deflections. Further, in embodiments, there is no electric connection between the actuators of the adjacent pixels.

In embodiments, the MEMS actuator can comprise a substrate, at least one post attached to the substrate, a deflectable actuator body that is connected to at least one of the posts via at least one spring and driving means that is configured to cause electrostatic, electromagnetic or magnetic force application to the deflectable actuator body that acts outside the area spanned by the post, wherein the actuator body takes a new equilibrium position as a reaction on the stated force application that results from an essentially pure (tilt-free) translation from its resting position. The effect outside the area spanned by the posts is related to the fact that the line of action of the driving force (straight line through the centroid of the driving force acting on the actuator body in the direction of this force) does not intersect the stated area. In the case of two (ideally thin) posts, the area degenerates into a path, in the case of one post into a point, which are not to lie on that line of action. In even more detail, the abutment areas of the springs at their posts can be considered. Then, accordingly, the line of action of the drive is to be outside the convex envelope of all these points/area elements (which would generally result in a tilt).

In embodiments, a weighted centroid can be positioned on a line of action of the drive. The line of action of the driving force can be a straight line through the centroid of the driving force acting on the actuator body in the direction of this force.

Although some aspects have been described in the context of an apparatus, it is obvious that these aspects also represent a description of the corresponding method, such that a block or device of an apparatus also corresponds to a respective method step or a feature of a method step. Analogously, aspects described in the context of a method step also represent a description of a corresponding block or detail or feature of a corresponding apparatus. Some or all of the method steps may be executed by a hardware apparatus (or by using a hardware apparatus), like, for example, a microprocessor, a programmable computer or an electronic circuit. In some embodiments, some or several of the most important method steps may be executed by such an apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A micro-electro-mechanical system (MEMS) actuator, comprising:
   a substrate;
   at least one post attached to the substrate; and
   a deflectable actuator body connected to the at least one post via at least one spring,
   a drive that is configured to apply an electrostatic, electromagnetic or magnetic force to the deflectable actuator body,
   wherein, during the electrostatic, electromagnetic or magnetic force application, the actuator body takes a second position starting from a first position by a tilt-free translational movement, wherein the first position and the second position are different; and
   wherein in a top view of the MEMS actuator at least 90% of the actuator body and a centroid of the actuator body are arranged outside an area, wherein if the at least one post consists of two posts the area is an area spanned by the at least two posts, and wherein if the at least one post consists of only one post the area is an area of the one post,
   wherein the at least one spring
      comprises no symmetry within a plane of its resting position,
      or is spiraled, wherein the at least one spring comprises a plurality of spring elements extending in different directions, wherein at least a first spring element of the plurality of spring elements extending in a first direction is configured to prevent a tilt of the deflectable actuator body around a first axis, wherein at least a second spring element of the plurality of spring elements extending in a second direction is configured to prevent a tilt of the deflectable actuator body around a second axis.

2. The MEMS actuator according to claim 1, wherein the deflectable actuator body performs the tilt-free translational movement parallel to a direction of the electrostatic, electromagnetic or magnetic force application.

3. The MEMS actuator according to claim 1, wherein the deflectable actuator body is only connected to the at least one spring in a contiguous area of a main surface of the deflectable actuator body, wherein the contiguous area is not greater than 30% of the main surface.

4. The MEMS actuator according to claim 1, wherein the at least one spring consists of only one spring.

5. The MEMS actuator according to claim 1, wherein the at least one post consists of only one post.

6. The MEMS actuator according to claim 1, wherein the deflectable actuator body comprises an actuator plate.

7. The MEMS actuator according to claim 6, wherein the actuator plate performs a tilt-free translational movement parallel to a direction perpendicular to the actuator plate.

8. The MEMS actuator according to claim 6, wherein the direction of the electrostatic, electromagnetic, or magnetic force application runs perpendicular to the actuator plate.

9. The MEMS actuator according to claim 6, wherein the drive comprises an electrode plate opposing the actuator plate.

10. The MEMS actuator according to claim 9, wherein the drive is configured to perform the electrostatic force application to the actuator plate via the electrode plate.

11. The MEMS actuator according to claim 1, wherein the at least one spring comprises a variable cross-section along the connection between the at least one post and the deflectable actuator body.

12. The MEMS actuator according to claim 1, wherein the at least one spring comprises a variable rigidity along the connection between the at least one post and the deflectable actuator body.

13. The MEMS actuator according to claim 1, wherein the first and second spring elements run parallel to one another in at least one deflection state of the deflectable actuator body.

14. The MEMS actuator according to claim 1, wherein a connecting point where the deflectable actuator body is connected to the at least one spring or is connected to the at least one spring via a connecting element coincides with a centroid of the deflectable actuator body or a centroid of the forces applied to the actuator body.

15. A system comprising: a plurality of MEMS actuators according to claim 1, wherein the MEMS actuators comprise a common substrate.

16. The system according to claim 15, wherein an actuator body of at least one of the MEMS actuators comprises a recess for arranging the post of a different one of the MEMS actuators.

17. A method for operating a micro-electro-mechanical system (MEMS) actuator, wherein the MEMS actuator comprises a substrate, at least one post attached to the substrate, a deflectable actuator body connected to the at least one post via at least one spring, and a drive that applies an electrostatic, electromagnetic or magnetic force to the deflectable actuator body, wherein in a top view of the MEMS actuator at least 90% of the actuator body and a centroid of the actuator body are arranged outside an area, wherein if the at least on post consists of at least two posts the area is an area spanned by the at least two posts, and wherein if the at least one post consists of only one post the area is an area of the one post,
   wherein the at least one spring
      comprises no symmetry within a plane of its resting position,
      or is spiraled, wherein the at least one spring comprises a plurality of spring elements extending in different directions, wherein at least a first spring element of the plurality of spring elements extending in a first direction is configured to prevent a tilt of the deflectable actuator body around a first axis, wherein at least a second spring element of the plurality of spring elements extending in a second direction is configured to prevent a tilt of the deflectable actuator body around a second axis, wherein the method comprises:
applying the electrostatic, electromagnetic or magnetic force to the deflectable actuator body, wherein, during the electrostatic, electromagnetic or magnetic force application, the actuator body takes a second position starting from a first position by a tilt-free translational movement, wherein the first position and the second position are different.

* * * * *